United States Patent
Gomikawa et al.

(10) Patent No.: US 8,093,664 B2
(45) Date of Patent: Jan. 10, 2012

(54) NON-VOLATILE SEMICONDUCTOR MEMORY DEVICE AND DEPLETION-TYPE MOS TRANSISTOR

(75) Inventors: Kenji Gomikawa, Yokohama (JP); Mitsuhiro Noguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 151 days.

(21) Appl. No.: 12/359,643

(22) Filed: Jan. 26, 2009

(65) Prior Publication Data
US 2009/0218637 A1    Sep. 3, 2009

(30) Foreign Application Priority Data

Feb. 29, 2008   (JP) ................................ 2008-050066

(51) Int. Cl.
*H01L 29/66*    (2006.01)
(52) U.S. Cl. . 257/403; 257/402; 257/344; 257/E29.255; 257/E29.062
(58) Field of Classification Search .................. 257/402, 257/403, 344, E29.062, E29.255
See application file for complete search history.

(56) References Cited

U.S. PATENT DOCUMENTS

| | | | | |
|---|---|---|---|---|
| 4,514,897 A | * | 5/1985 | Chiu et al. ...................... | 438/257 |
| 4,990,974 A | * | 2/1991 | Vinal ............................. | 257/403 |
| 5,151,759 A | * | 9/1992 | Vinal ............................. | 257/348 |
| 5,194,923 A | * | 3/1993 | Vinal ............................. | 257/268 |
| 5,371,396 A | * | 12/1994 | Vinal et al. ..................... | 257/412 |
| 5,374,836 A | * | 12/1994 | Vinal et al. ..................... | 257/344 |
| 5,952,701 A | * | 9/1999 | Bulucea et al. ................ | 257/407 |
| 6,809,967 B2 | | 10/2004 | Noguchi et al. | |
| 7,274,603 B2 | | 9/2007 | Futatsuyama et al. | |
| 2006/0186942 A1 | | 8/2006 | Futatsuyama et al. | |
| 2009/0218637 A1 | * | 9/2009 | Gomikawa et al. ............ | 257/402 |

FOREIGN PATENT DOCUMENTS

| | | |
|---|---|---|
| JP | 6-291076 | 10/1994 |
| JP | 2002-222943 | 8/2002 |
| JP | 2006-100693 | 4/2006 |
| JP | 2006-196061 | 7/2006 |

OTHER PUBLICATIONS

U.S. Appl. No. 12/788,784, filed May 27, 2010, Kutsukake, et al.
Office Action issued Nov. 25, 2010, in Korean Patent Application No. 10-2009-0016801 (with English translation).
Office Action issued Aug. 29, 2011, in Japanese Application No. 10-2009-16801 (with English-language Translation).

* cited by examiner

*Primary Examiner* — Jarrett Stark
(74) *Attorney, Agent, or Firm* — Oblon, Spivak, McClelland, Maier & Neustadt, L.L.P.

(57) ABSTRACT

A peripheral circuit includes at least a first transistor. The first transistor comprises a gate electrode formed on a surface of a semiconductor layer via a gate insulating film. A channel region of a first conductivity type having a first impurity concentration is formed on a surface of the semiconductor layer directly below and in the vicinity of the gate electrode. A source-drain diffusion region of the first conductivity type is formed on the surface of the semiconductor layer to sandwich the gate electrode and has a second impurity concentration greater than the first impurity concentration. An overlapping region of the first conductivity type is formed on the surface of the semiconductor layer directly below the gate electrode where the channel region and the source-drain diffusion region overlap. The overlapping region has a third impurity concentration greater than the second impurity concentration.

15 Claims, 13 Drawing Sheets

NON-VOLATILE SEMICONDUCTOR MEMORY DEVICE AND DEPLETION-TYPE MOS TRANSISTOR

CROSS REFERENCE TO RELATED APPLICATIONS

This application is based on and claims the benefit of priority from prior Japanese Patent Application No. 2008-50066, filed on Feb. 29, 2008, the entire contents of which are incorporated herein by reference.

BACKGROUND OF THE INVENTION

1. Field of the Invention

This invention relates to a non-volatile semiconductor memory device and a depletion-type MOS transistor included in non-volatile semiconductor devices and the like.

2. Description of the Related Art

Conventionally, a non-volatile semiconductor memory device enabling electrical rewriting is known as one kind of semiconductor memory devices. Among such non-volatile semiconductor memory devices, a NAND flash memory including NAND cell blocks with a plurality of memory cells connected in series is widely used, since it has a high level of integration.

A memory cell formed in the NAND flash memory has a MOSFET structure in which a floating gate (charge accumulation layer) and a control gate are layered on a semiconductor substrate via an insulating film. A plurality of memory cells are connected in series, and neighboring cells share a source and a drain to form a NAND cell unit. A NAND cell unit is connected to the bit line as a single unit. This kind of NAND cell is arranged as a matrix to constitute a memory cell array. The memory cell array is integratedly formed on a p type semiconductor substrate or in a p type well region.

In a NAND flash memory, a voltage higher than the power supply voltage must be transferred to the control gate line in the selected block. In order to transfer this kind of high voltage to the memory cell, a conventional NAND flash memory is equipped with a row decoder circuit including a voltage conversion circuit that converts the power supply voltage into this kind of high voltage (see, for example, JP 2006-196061 A). Such a row decoder generally includes plural kinds of MOS transistors such as: an enhancement-type (E-type) n-channel MOS transistor with high-breakdown voltage; depletion-type (D-type) n-channel MOS transistors with high-breakdown voltage; and E-type p-channel MOS transistors with high breakdown-voltage.

Conventionally, on forming such MOS transistors, a channel implantation that implants impurities into the channel portion is carried out to adjust the threshold voltage. P-type impurities such as boron (B) and the like are used in the channel implantation of E-type n-channel MOS transistors. On the other hand, in the channel implantation of D-type n-channel MOS transistors, the n type impurity such as arsenic (As) is used. When such n type impurity is injected/implanted into areas including the region where the source-drain diffusion region is to be formed, the diffusion layer resistance of the source-drain diffusion regions formed later becomes lower, and so-called soft breakdown may occur in the transistor. This phenomenon is regarded as a problem.

In addition, a surface breakdown voltage of a transistor is generally classified into two kinds of voltages. One of them is called "intrinsic breakdown voltage" by which a transistor is completely destroyed. The other is called "soft breakdown voltage" by which a leakage current increases. The intrinsic breakdown voltage is higher than the soft breakdown voltage.

The voltage applied to a source, a drain and a gate of a transistor differs according to the types (E-type or D-type, n-channel or p-channel) and application purpose or usage of the transistor.

Depending on the application of the transistor, in some cases it is required that the soft breakdown voltage be high while the intrinsic breakdown voltage may be low, and vice-versa.

However, the intrinsic breakdown voltage is higher than the soft breakdown voltage. Thus, if attempting to obtain a high soft breakdown voltage, it is necessary to enlarge the entire area of the transistor. As a result there has been a problem that the chip area occupied by peripheral circuits becomes larger.

SUMMARY OF THE INVENTION

A non-volatile semiconductor memory device in accordance according to one aspect of the present invention comprises a memory cell array including memory cell transistors arranged therein, the memory cell transistors being provided with a charge accumulation layer formed on a semiconductor substrate via a gate insulating film; and a peripheral circuit configured to drive the memory cell transistors, the peripheral circuit including at least a first transistor. The first transistor further comprises: a semiconductor layer of a second conductivity type; a gate electrode formed on a surface of the semiconductor layer via the gate insulating film; a channel region of a first conductivity type having a first impurity concentration and formed on a surface of the semiconductor layer directly below and in the vicinity of the gate electrode, the first conductivity type being of the opposite conduction type to the second conductivity type; a source-drain diffusion region of the first conductivity type having a second impurity concentration which is greater than the first impurity concentration and formed on the surface of the semiconductor layer to sandwich the gate electrode; and an overlapping region of the first conductivity type having a third impurity concentration which is greater than the second impurity concentration and formed on the surface of the semiconductor layer directly below the gate electrode where the channel region and the source-drain diffusion region overlap.

A depletion-type MOS transistor according to an aspect of the present invention comprises a semiconductor layer of a second conductivity type;

a gate electrode formed on a surface of the semiconductor layer via a gate insulating film;

a channel region of a first conductivity type having a first impurity concentration and formed on a surface of the semiconductor layer directly below and in the vicinity of the gate electrode, the first conductivity type being of the opposite conduction type to the second conductivity type; a source-drain diffusion region of the first conductivity type having a second impurity concentration which is greater than the first impurity concentration and formed on the surface of the semiconductor layer to sandwich the gate electrode; and an overlapping region of the first conductivity type having a third impurity concentration which is greater than the second impurity concentration and formed on the surface of the semiconductor layer directly below the gate electrode where the channel region and the source-drain diffusion region overlap.

DETAILED DESCRIPTION OF THE EMBODIMENTS

Next, embodiments of the present invention are explained in detail with reference to the drawings.

Figure 1:
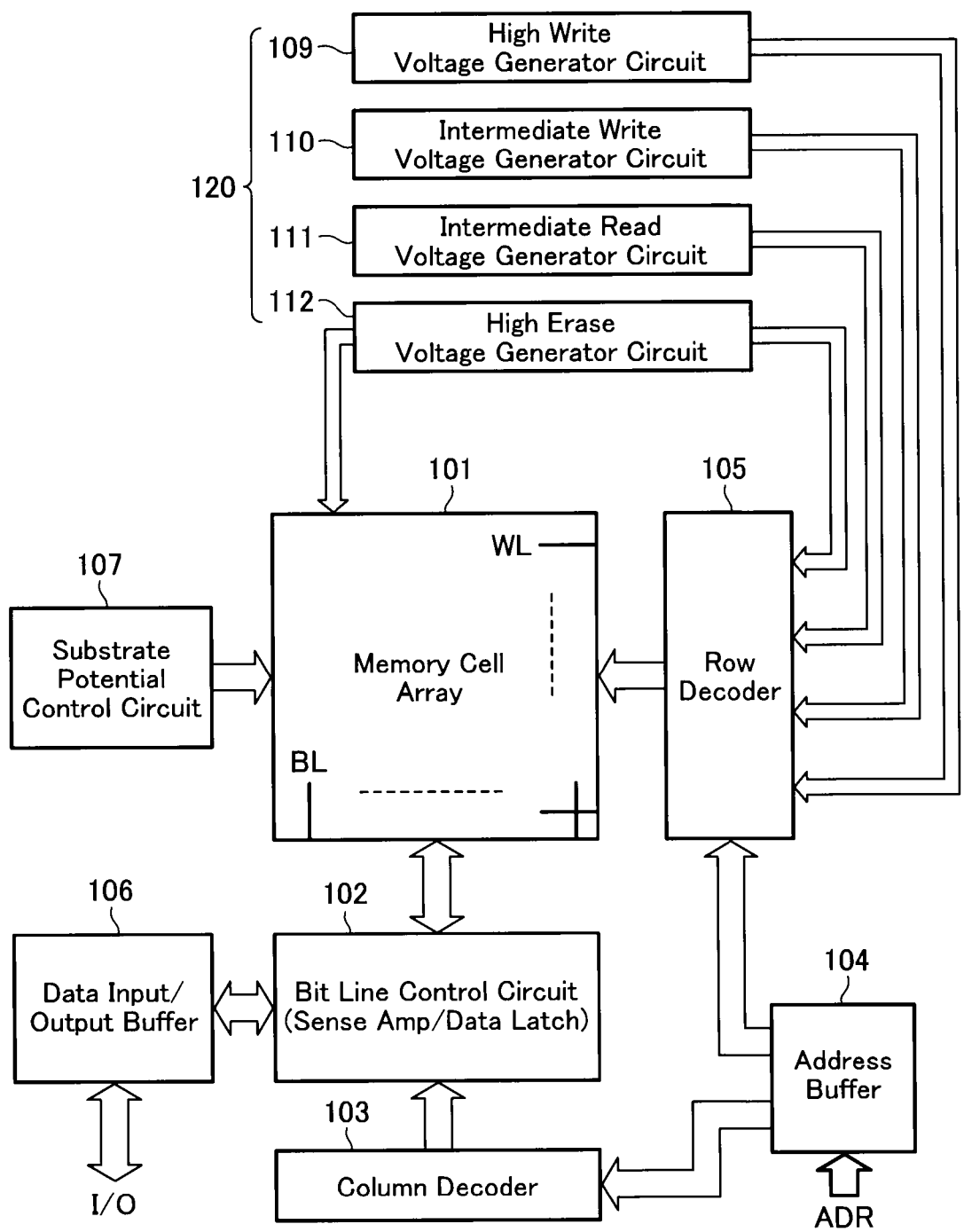
FIG. 1 is a block diagram showing the schematic configuration of a NAND flash memory in accordance with an embodiment of the present invention.

Hereafter, embodiments of the present invention are described with reference to the drawings. FIG. 1 explains a semiconductor memory device in accordance with an embodiment of the present invention and is a block diagram showing the schematic configuration of a NAND flash memory.

A memory cell array 101 is provided with a bit line control circuit (sense amplifier/data latch) 102 to perform write, read, rewrite and verify read of data. This bit line control circuit 102 is connected to a data input/output buffer 106 and receives as input the output of a column decoder 103 which receives an address signal from an address buffer 104.

In addition, the memory cell array 101 is provided with a row decoder 105 to control the control gates and selection gates, and a substrate voltage control circuit 107 to control an electrical potential of a p type silicon substrate (or p type well region) that constitutes the memory cell array 101. Furthermore, four kinds of voltage generator circuit 120 are provided as circuits to generate a voltage supplied to memory cells and so on and necessary for read, write, and so on. Specifically, a high write voltage generator circuit 109 and an intermediate write voltage generator circuit 110 are provided to generate a high write voltage Vpp (up to 20V) and an intermediate write voltage Vmg (up to 10V), respectively, during data write operation.

Moreover, an intermediate read voltage generator circuit 111 is provided to generate an intermediate read voltage Vread during data read, and a high erase voltage generator circuit 112 is provided to generate a high erase voltage Vpp (up to 20V) during erase operation.

Figure 2:
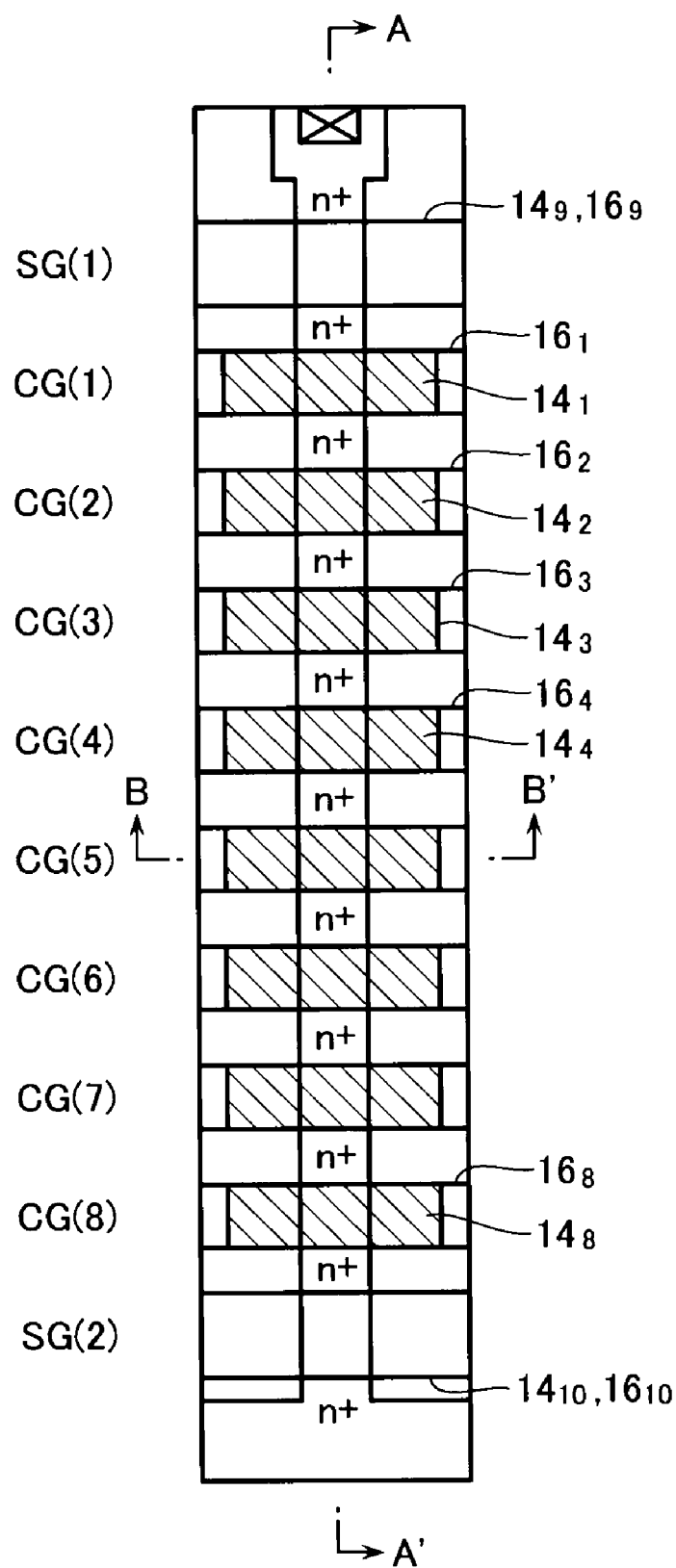
FIG. 2 shows a plan view of a single NAND cell portion in the memory cell array 101 shown in FIG. 1.
Figure 3:
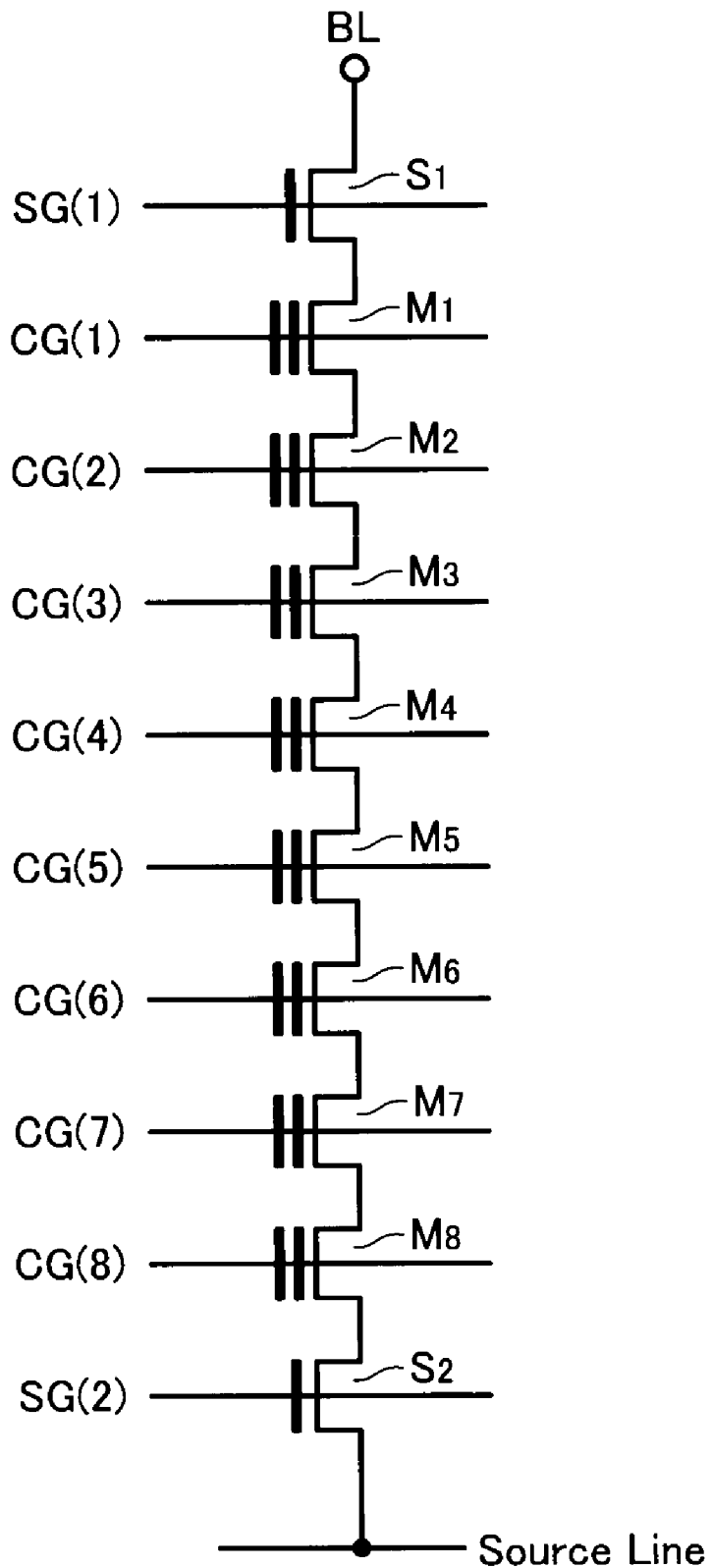
FIG. 3 is an equivalent circuit diagram of a single NAND cell portion in the memory cell array shown in FIG. 1.
Figure 4:
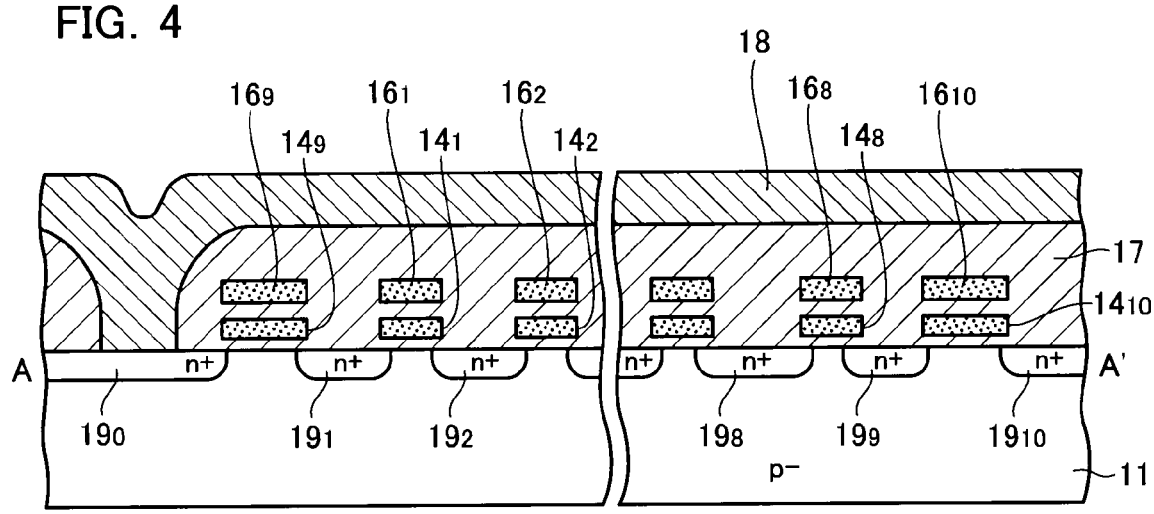
FIG. 4 is a cross-sectional view taken along the line A-A' of FIG. 2.
Figure 5:
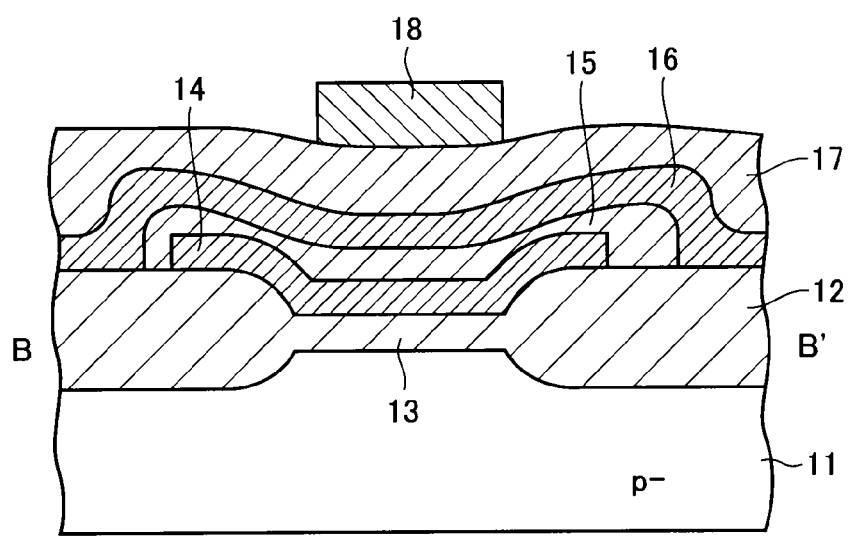
FIG. 5 is a cross-sectional view taken along the line B-B' of FIG. 2.

The bit line control circuit 102 is comprised mainly of CMOS flip-flops and performs latching of data for write and a sense operation to read a bit line potential, also a sense operation to verify read after write, and, additionally, latching of rewrite data. FIGS. 2 and 3 are respectively a plan view and an equivalent circuit diagram of a single NAND cell portion in the above-mentioned memory cell array 101, and FIGS. 4 and 5 are cross-sectional views taken along the lines A-A' and B-B', respectively, of FIG. 2.

A memory cell array comprising a plurality of NAND cells is formed on a p type silicon substrate (or p type well region) 11 surrounded by an element isolation insulating film 12. Focusing explanation on a single NAND cell, in this embodiment, for example, a plurality of memory cells Mi are connected in series to constitute a single NAND cell. Here, for convenience of explanation, the number of memory cells Mi in a single NAND cell is 8, although obviously the present invention is not limited to this number.

The memory cells M1-M8 are respectively structured such that a floating gate 14 ($14_1$, $14_2$, ..., $14_8$) is formed on a substrate 11 via a gate insulating film 13, and a control gate 16 (=wordline: $16_1$, $16_2$, ..., $16_8$) is formed above this floating gate 14 via an insulating film 15. An n type diffusion layer 19 ($19_0$, $19_1$, ..., $19_{10}$) as a source/drain of these memory cells is connected in such a way that neighboring cells share a source and a drain, whereby the memory cells are connected in series.

The drain side and source side of the NAND cell are respectively provided with a select gate $14_9$, $16_9$ and $14_{10}$, $16_{10}$ formed simultaneously with the floating gate and control gate of the memory cell, whereby a select transistor is formed. The substrate 11 on which elements are formed is covered by an insulating film 17, and a bit line 18 is disposed thereon. The bit line 18 is connected to the drain side diffusion layer $19_0$ formed at one end of the NAND cell.

Control gates 16 of the NAND cell aligned in a row direction are commonly connected to control gate lines CG(1), CG(2), ..., CG(8). These control gates form word lines.

Also, select gates $14_9$, $16_9$ and $14_{10}$, $16_{10}$ aligned in a row direction are commonly connected to select gate lines SG(1) and SG(2), respectively.

Figure 6:
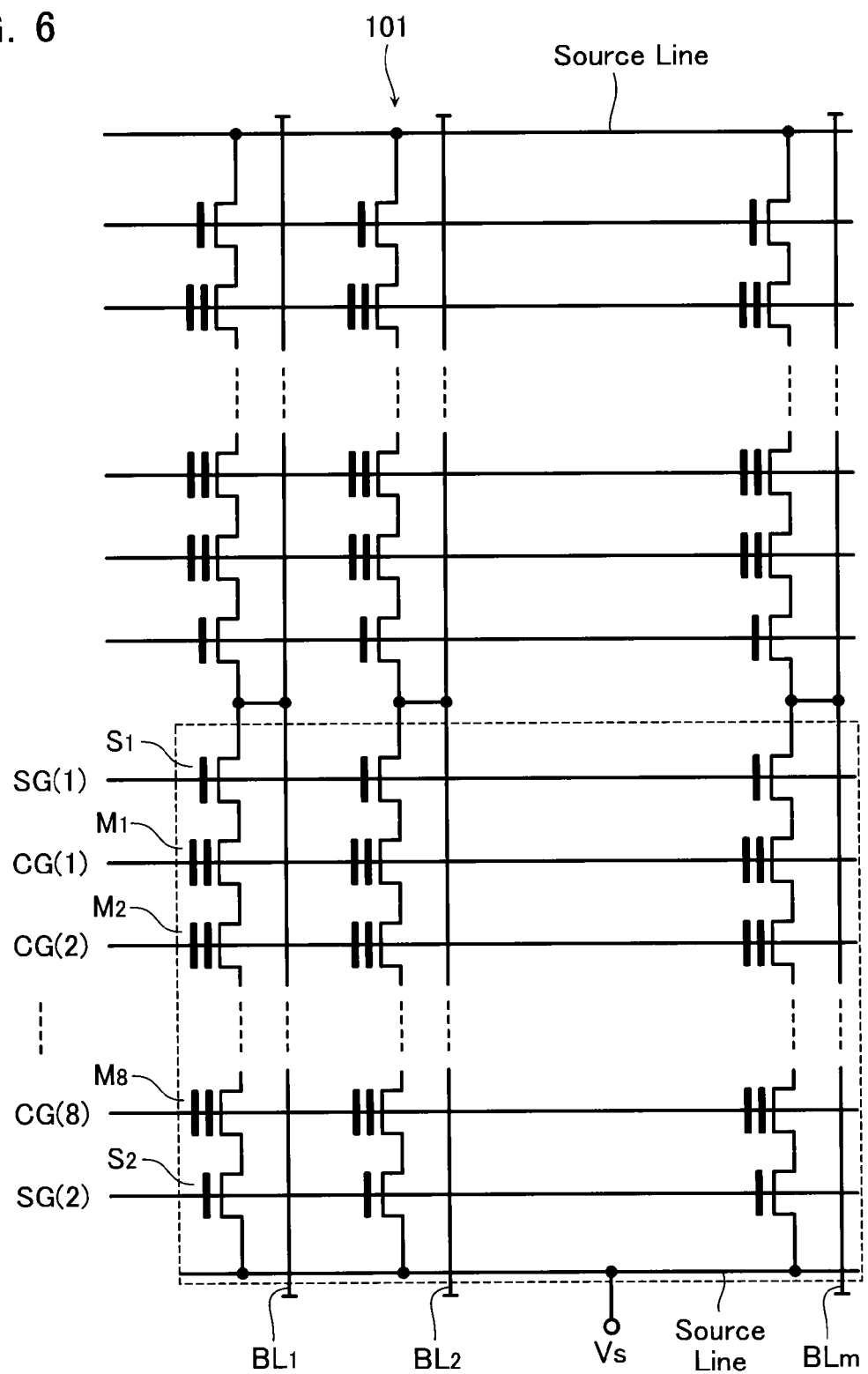
FIG. 6 shows an equivalent circuit diagram of the memory cell array 101 of FIG. 1 in which NAND cells like those of FIG. 2 and FIG. 3 are arranged as a matrix.

FIG. 6 shows an equivalent circuit diagram of a memory cell array in which the NAND cells are arranged in a matrix. The region surrounded by a dotted line in FIG. 6 including a group of NAND cells that share the same word lines and select gate lines is called "a block". During ordinary read and write operation only one of a plurality of blocks (called a selected block) is selected.

Figure 7:
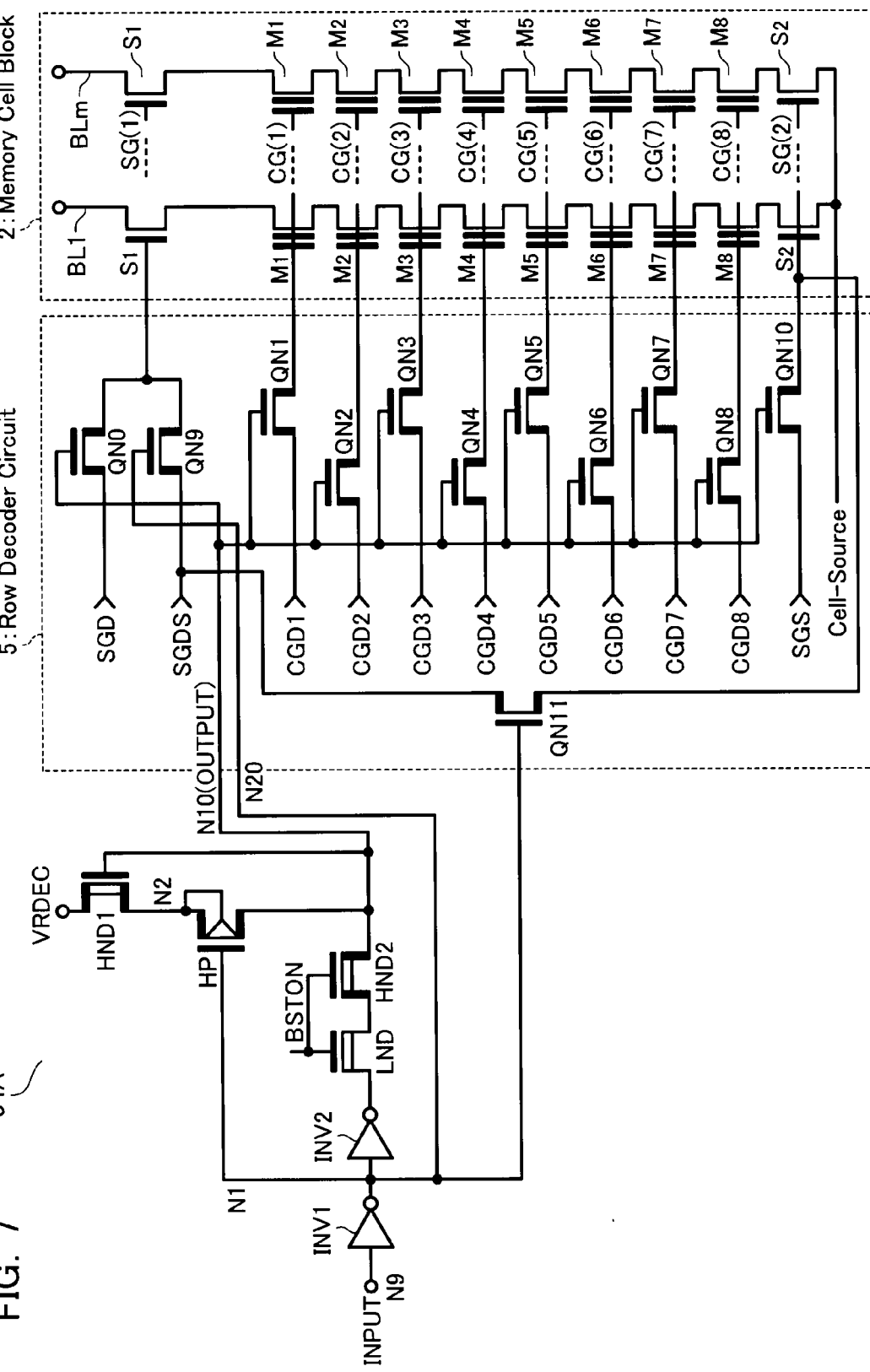
FIG. 7 shows a configuration example of the row decoder 105 shown in FIG. 1 and a configuration example of the voltage switching circuit 54A included therein.

FIG. 7 shows a configuration example of the row decoder 105. FIG. 7 shows the case where the row decoder circuit 5 that forms the row decoder 105 is disposed on one side of a single memory cell block 2 within the memory cell array 101. Row decoder circuit 5 is provided with transfer transistors QN0-QN11 (with threshold voltage Vth(QN)) connected to control gate lines CG(1)-CG(8) and select gate lines SG(1) and SG(2). In the circuit of FIG. 7 the MOS transistors QN0-QN11 connected to control gate lines CG(1)-CG(8) and select gate lines SG(1) and SG(2) are all of E-type n-channel type. Furthermore, each one of the transistors QN1-QN8 is connected to a respective one of the control gate lines CG(1)-CG(8).

That is to say, connection between the control gate lines CG(1)-CG(8) and signal input nodes CGD1-CGD8 thereof is effected via the current paths of the NMOS transistors QN1-QN8, respectively. Moreover, connection between select gate line SG(1) and signal input nodes SGD and SGDS thereof is effected via the current paths of the NMOS transistors QN0 and QN9, respectively. Furthermore, connection between the select gate line SG(2) and signal input nodes SGS and SGDS thereof is effected via the current paths of the NMOS transistors QN10 and QN11.

In addition, a voltage switching circuit 54A is provided to set the gate voltage of the NMOS transistors QN0-QN11 and switch the voltage of the control gate lines CG(1)-CG(8), and the select gate lines SG(1) and SG(2). This voltage switching circuit 54A outputs a different magnitude of output voltage OUTPUT to the output node N10 in response to switching of an input voltage INPUT and a control signal BSTON. The input voltage INPUT is set to the power supply voltage Vdd on selecting memory cell block 2 to which the voltage switching circuit 54A is connected, and is set to a reference voltage Vss in the case of non-selection thereof.

Moreover, an inverted signal /INPUT of the input voltage INPUT is input to a node N20, namely, the gates of the transistors QN9 and QN11. Accordingly, only one of the transfer transistors QN0 and QN9 is in a state of conduction; likewise, only one of the transfer transistors QN11 and QN9 is in a state of conduction.

Note that in FIG. 7, instead of single n-channel MOS transistors QN0-QN11, transfer gates configured as a p-channel MOS transistor and an n-channel MOS transistor connected in parallel may also be formed, one for each control gate or select gate.

The voltage switching circuit 54A is provided with a transistor HND1 and a transistor HP connected in series to the transistor HND1 at a node N2 (source of transistor HND1) between an output node N10 and a power supply node VRDEC. The transistor HND1 is a high-breakdown-voltage depletion-type (D-type) n-channel MOS transistor with a negative value threshold voltage Vth (HND1). The transistor HP is a high-breakdown-voltage, enhancement-type (E-type), p-channel MOS transistor with a negative value threshold voltage Vth (HP).

The transistor HND1 has a drain connected to a power supply node VRDEC, a source connected to the source of transistor HP at the node N2, and a gate provided with the output voltage OUTPUT as a positive feedback.

Since the transistor HND1 is provided with a high voltage applied between source and drain and between source and gate, it must be of a high-breakdown-voltage type. Therefore, a gate-contact distance of the transistor HND1 is formed longer than that of a low-breakdown-voltage transistor (such as LND explained hereafter). In addition, a gate insulating film of the transistor HND1 is formed thicker than that of a low-breakdown-voltage transistor.

Moreover, the threshold voltage Vth (HND1) of the transistor HND1 is set to a negative value (D-type) so that the high voltage Vpp can be transferred to the node N2 when the high voltage Vpp is applied to the power supply node VRDEC and to the gate of the transistor HND1.

Furthermore, the voltage switching circuit 54A includes inverter circuits INV1 and INV2, low-breakdown-voltage D-type n-channel MOS transistor LND and high-breakdown-voltage D-type n-channel MOS transistor HND2, all of which connected in series between a node N9 where the input voltage INPUT is input and the output node N10. The low-breakdown-voltage D-type n-channel MOS transistor LND has a negative threshold voltage Vth (LND), while the high-breakdown-voltage D-type n-channel MOS transistor HND2 has a negative threshold voltage Vth (HND2).

The transistors LND and HND2 are provided with a control signal BSTON applied to gates thereof and together configures a switching circuit.

Note that the transistor HND1 must have a high intrinsic breakdown voltage, since a low voltage generated in the output node N10 may be applied to the gate electrode of the transistor HND1. The intrinsic breakdown voltage means a voltage by which the transistor is completely destroyed. In contrast, the transistor HND1 is not required to have a high soft breakdown voltage, since the potential difference between source and drain thereof is not so large.

On the other hand, the transistor HND2 is required to have a high soft breakdown voltage, since the potential difference between source and drain thereof during OFF-state is high.

As described, the voltage switching circuit 54A includes, as high-breakdown-voltage MOS transistors, the D-type n-channel MOS transistors HND1 and HND2, and the E-type p-channel MOS transistor HP. Meanwhile, the MOS transistors QN0-QN11 in the row decoder circuit 5 are E-type n-channel MOS transistors. As described, various types of high-breakdown-voltage MOS transistors are included in the peripheral circuits that controls memory cell array 101. In particular, some of the high-breakdown-voltage D-type n-channel MOS transistors require a high intrinsic voltage, while the others require a high soft breakdown voltage.

These transistors are treated with channel implantation to adjust their threshold voltages. Generally, channel implantation of D-type n-channel MOS transistors is applied to the entire active area including also the regions where the source-drain diffusion regions are formed.

In contrast, in the embodiment of the present invention, in channel implantation to the D-type n-channel MOS transistors, impurities are implanted only at a surface of a semiconductor layer directly below and in the vicinity of the gate electrode. Here, a "semiconductor layer" means a semiconductor substrate itself in one case. In another case, it means a well region formed in the semiconductor substrate. Also, "directly below and in the vicinity of the gate electrode" means that the channel region formed by channel implantation is slightly larger than the area of the gate electrode by a range of 10 nm-1 μm in the current-path direction from the edge of the gate electrode.

Consequently, the channel region and the source-drain diffusion regions overlap only in a narrow region directly below the edge of the gate electrode. That overlapping part is hereafter referred to as "overlapping region". The impurity concentration of the overlapping region is greater than that of the source-drain diffusion regions. This characteristic is hereafter explained with reference to the drawings.

Figure 8:
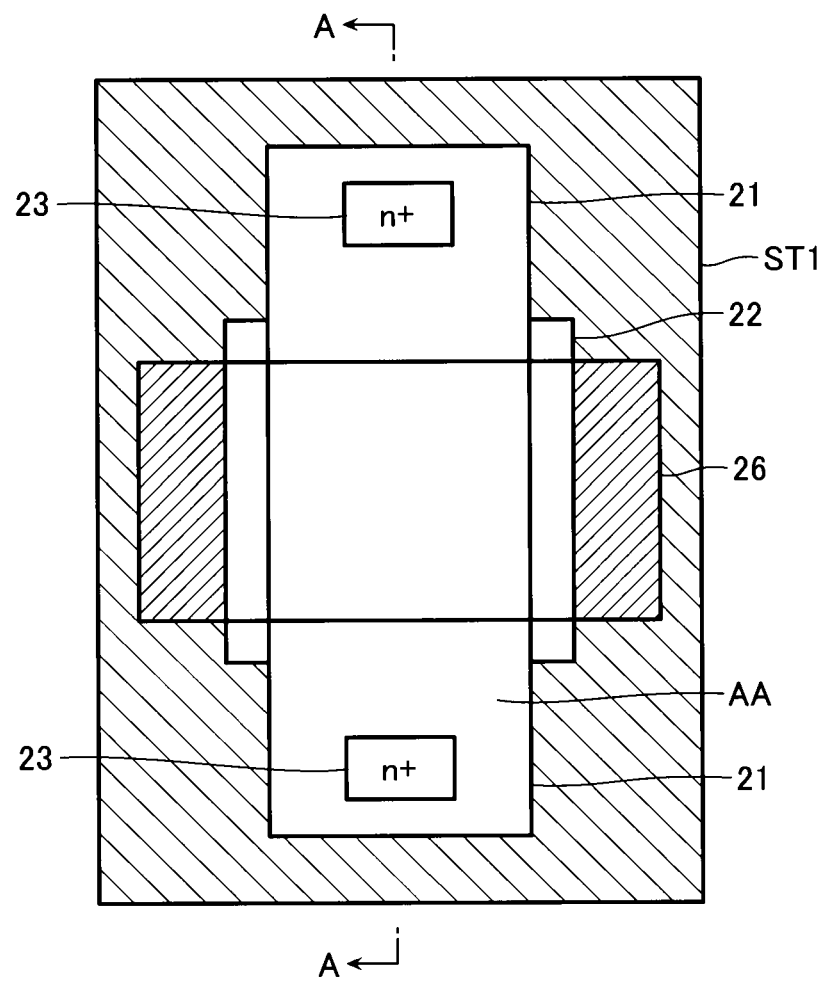
FIG. 8 is a plan view showing the configuration of a D-type n-channel MOS transistor included in the semiconductor memory device in accordance with an embodiment of the present invention.
Figure 9:
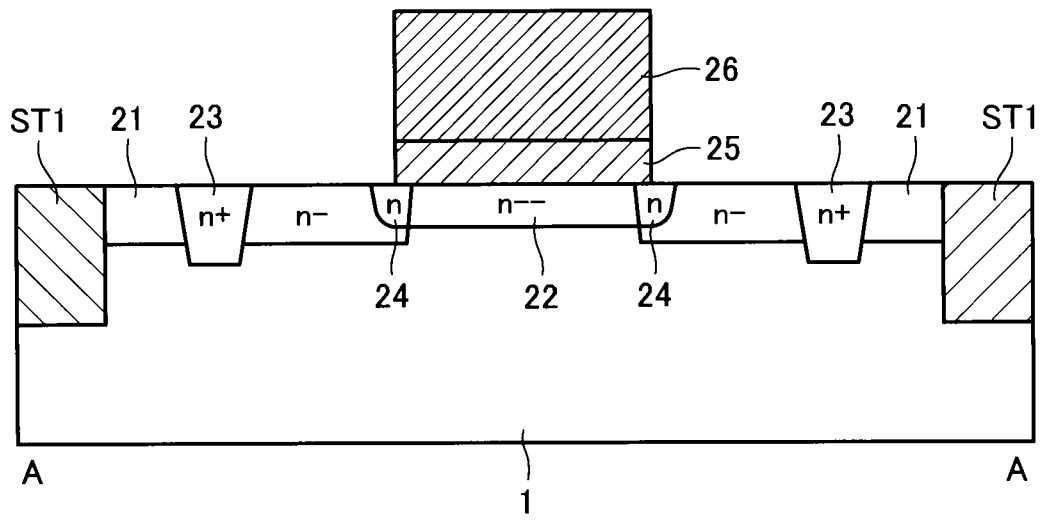
FIG. 9 is a cross-sectional view showing the configuration of a D-type n-channel MOS transistor included in the semiconductor memory device in accordance with an embodiment of the present invention.

FIG. 8 shows a plan layout of the D-type n-channel MOS transistor in accordance with an embodiment of the present invention, and FIG. 9 shows a cross-sectional view taken along the line A-A of FIG. 8. In addition, FIG. 10 shows a plan layout of a conventional D-type n-channel MOS transistor, and FIG. 11 shows a cross-sectional view taken along the line A-A of FIG. 10.

Figure 10:
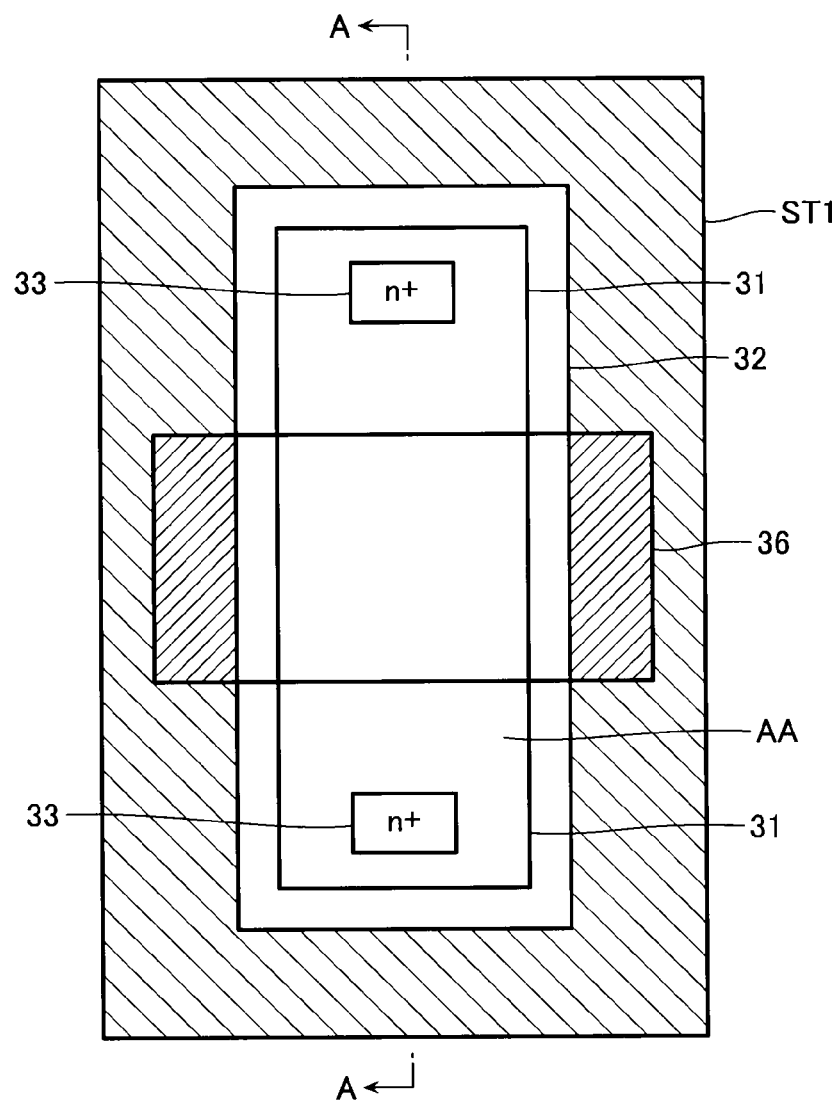
FIG. 10 is a plan view showing the configuration of a conventional D-type n-channel MOS transistor.
Figure 11:
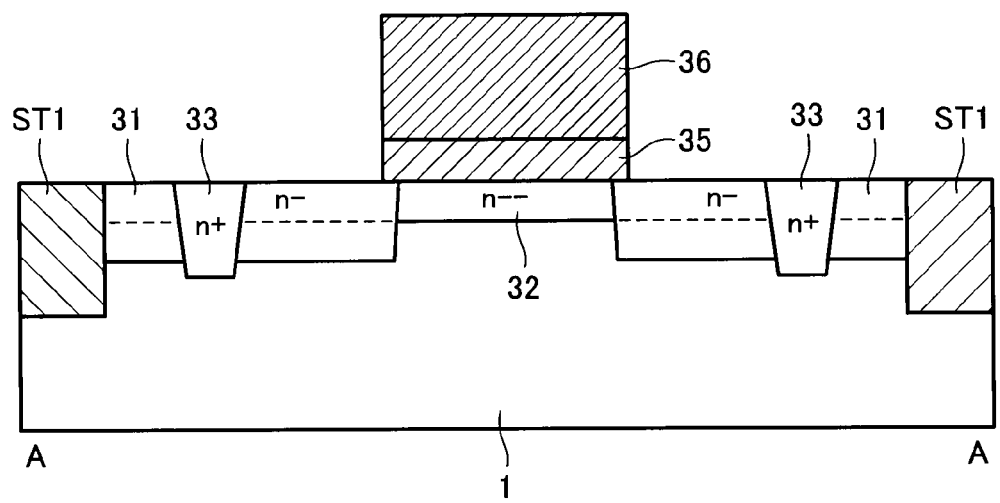
FIG. 11 is a cross-sectional view showing the configuration of a conventional D-type n-channel MOS transistor.

As shown in FIGS. 8 and 10, an active area AA surrounded by an element isolation insulating film ST1 is provided, and a gate electrode 26 is formed to cross this active area AA. That is to say, the n-channel MOS transistor according to the embodiment of the present invention is of the same size as the conventional structure and does not have an enlarged element area compared to the conventional structure.

As shown in FIGS. 8 and 9, the D-type n-channel MOS transistor in accordance with an embodiment of the present invention has, on a p type semiconductor substrate 1, an n type (n−) source-drain diffusion region 21; an n−− type channel region 22 with an impurity concentration lower than that of the source-drain diffusion region 21; an n+ type contact region 23 with an impurity concentration higher than that of the source-drain diffusion region 21; and an overlapping region 24.

Here, the symbols "+" and "−" following "n" express relative impurity concentration. Specifically, "n+" represents a higher concentration of impurity introduced than in "n", "n−" indicates a lower concentration of impurity compared to "n", and "n−−" expresses an impurity concentration lower than that of "n−".

A gate electrode 26 is formed on the surface of the semiconductor substrate 1 via a gate insulating film 25. Note that this example describes the case where the transistor is formed above the semiconductor substrate 1, but the invention of the present application is not limited to this case and the transistor may also be formed in a well region formed on the substrate 1.

The source-drain diffusion region 21 is formed in a self-aligning manner with respect to the gate electrode 26 by ion injection/implantation, thereby sandwiching the gate electrode. Phosphorus (P), for example, may be used as an impurity during ion injection/implantation.

Meanwhile, the channel region 22 exists only in a region directly below and in the vicinity of gate electrode 26 and gate insulating film 25, and is formed to have a size such that it is larger than the gate electrode 26 by the range of 10 nm-1 µm from the edge of the gate electrode 26. Note that, for the ion injection/implantation to the channel region 22, an impurity different from one used in the ion injection/implantation to the source-drain diffusion region 21 may be used to make the depth of injection shallower. Arsenic (As) may be used for the impurity, for example.

The source-drain diffusion region 21 and the channel region 22 slightly overlap near the edge of the gate electrode 26 and form an overlapping region 24 there. The overlapping region 24 is an n type region with impurities higher than those of source-drain diffusion region 21. This overlapping region 24 includes two different impurities, for example, phosphorus, arsenic, or the like.

Moreover, an n+ type contact region 23 is formed on the surface of the source-drain diffusion region 21. Arsenic (As), for example, may be used as an impurity in the ion injection/implantation to this contact region 23, similarly to channel region 22. The maximum value of impurity concentration (peak concentration) and the junction depth of each part 21-24 are given below as an example.

For source-drain diffusion region 21, the peak concentration is from $5 \times 10^{17}$ to $3 \times 10^{18}$ cm$^{-3}$ and the junction depth is 250 nm or less.

For channel region 22, the peak concentration is from $1 \times 10^{17}$ to $5 \times 10^{17}$ cm$^{-3}$ and the junction depth is 300 nm or less.

For contact region 23, the peak concentration is from $1 \times 10^{19}$ to $1 \times 10^{21}$ cm$^{-3}$ and the junction depth is 300 nm or less.

And for overlapping region 24, the peak concentration is from $6 \times 10^{17}$ to $3.5 \times 10^{18}$ cm$^{-3}$ and the junction depth is 300 nm or less.

Meanwhile, as shown in FIGS. 10 and 11, a conventional D-type n-channel MOS transistor has, on a p type semiconductor substrate 1, an n type source-drain diffusion region 31, an n−− type channel region 32 with an impurity concentration lower than that of the source-drain diffusion region 31, and an n+ type contact region 33 with an impurity concentration higher than that of the source-drain diffusion region 31.

A gate electrode 36 is formed on the surface of the semiconductor substrate 1 via a gate insulating film 35.

The channel region 32 is formed not only in the region directly below gate electrode 36 but in the entire active area including also the region where source-drain diffusion region 31 is to be formed. Furthermore, an overlapping region corresponding to overlapping region 24 is not formed. In other words, the overlapping region in the transistor of FIG. 10 is formed along the entirety of source-drain diffusion region 31. This differs from the transistor of FIG. 9 in which the overlapping region 24 is formed only in the area directly below the edge of gate electrode 26.

The peak concentration and the junction depth of each part 31-33 are given below as an example. For source-drain diffusion region 31, the peak concentration is from $6 \times 10^{17}$ to $3.5 \times 10^{18}$ cm$^{-3}$ and the junction depth is 300 nm or less.

For channel region 32, the peak concentration is from $1 \times 10^{17}$ to $5 \times 10^{17}$ cm$^{-3}$ and the junction depth is 300 nm or less.

And for contact region 33, the peak concentration is from $1 \times 10^{19}$ to $1 \times 10^{21}$ cm$^{-3}$ and the junction depth is 300 nm or less.

Figure 12:
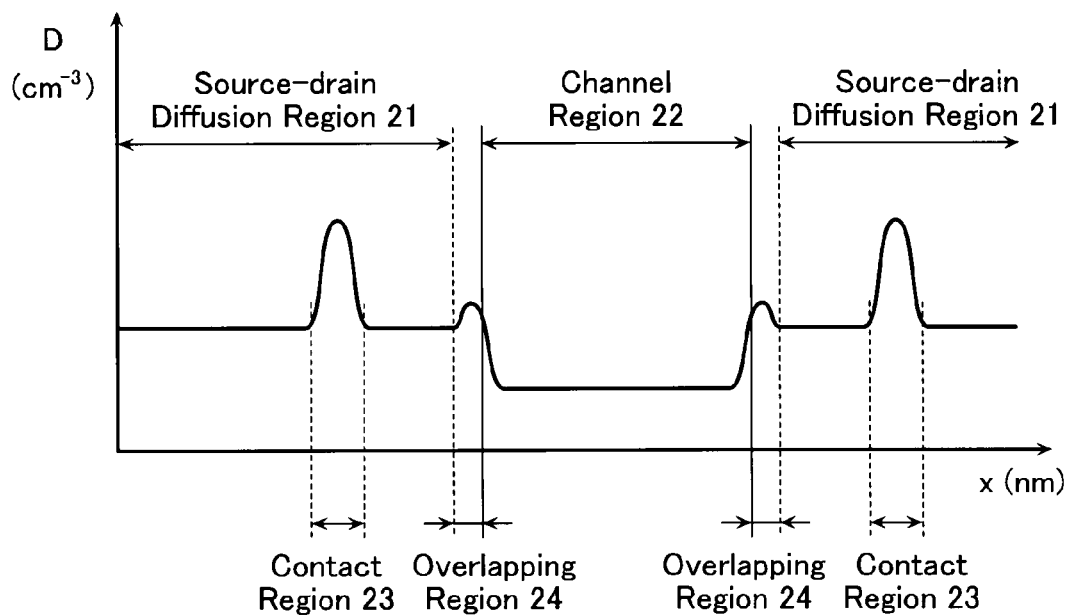
FIG. 12 is a graph showing characteristics of the transistor shown in FIG. 8.
Figure 13:
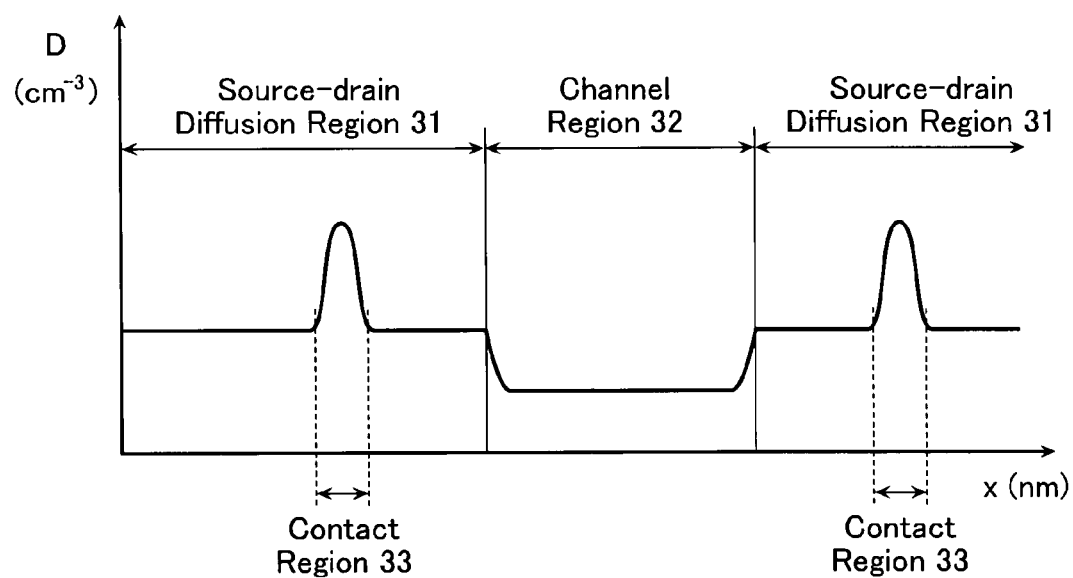
FIG. 13 is a graph showing characteristics of the transistor shown in FIG. 10.

FIG. 12 shows the distribution of peak concentration of the transistor shown in FIGS. 8 and 9, and FIG. 13 shows the distribution of peak concentration of the transistor shown in FIGS. 10 and 11. As is clear from FIGS. 12 and 13, in the transistor shown in FIGS. 8 and 9, the peak concentration is raised in the overlapping region 24 and the peak concentration in the overlapping region 24 is greater than that of the source-drain diffusion region 21. This differs from the transistor shown in FIGS. 10 and 11.

Figure 14:
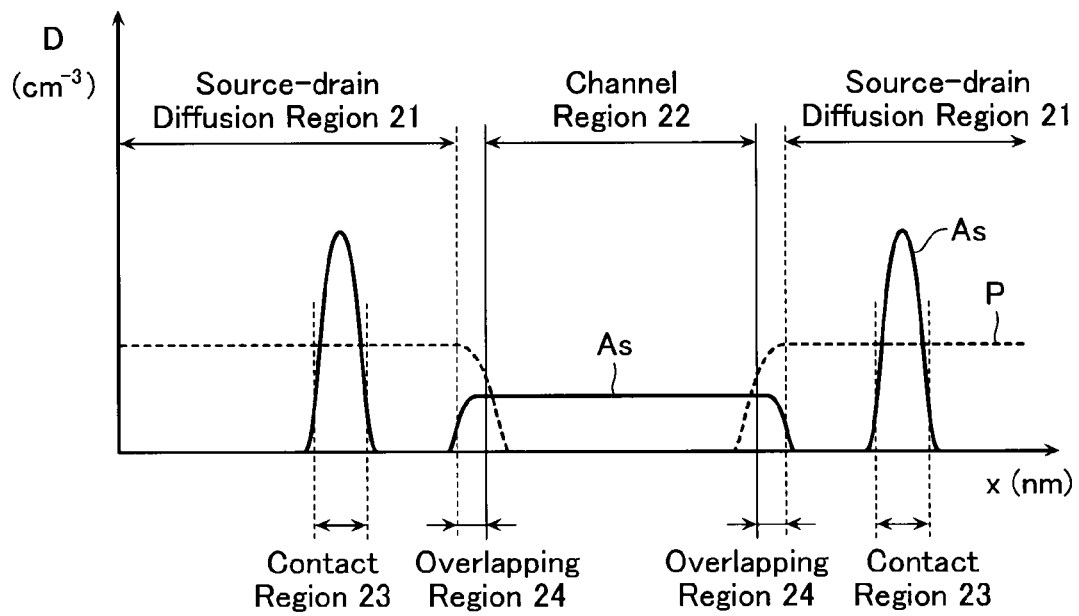
FIG. 14 shows the distributions of the concentration of phosphorus (P) and the concentration of arsenic (As) within the semiconductor substrate 1 of the transistor shown in FIGS. 8 and 9.

FIG. 14 shows the distributions of the concentration of phosphorus (P) and the concentration of arsenic (As) within the semiconductor substrate 1 shown in FIGS. 8 and 9 (the former is illustrated by a dotted line graph, the latter a solid line graph).

Figure 15:
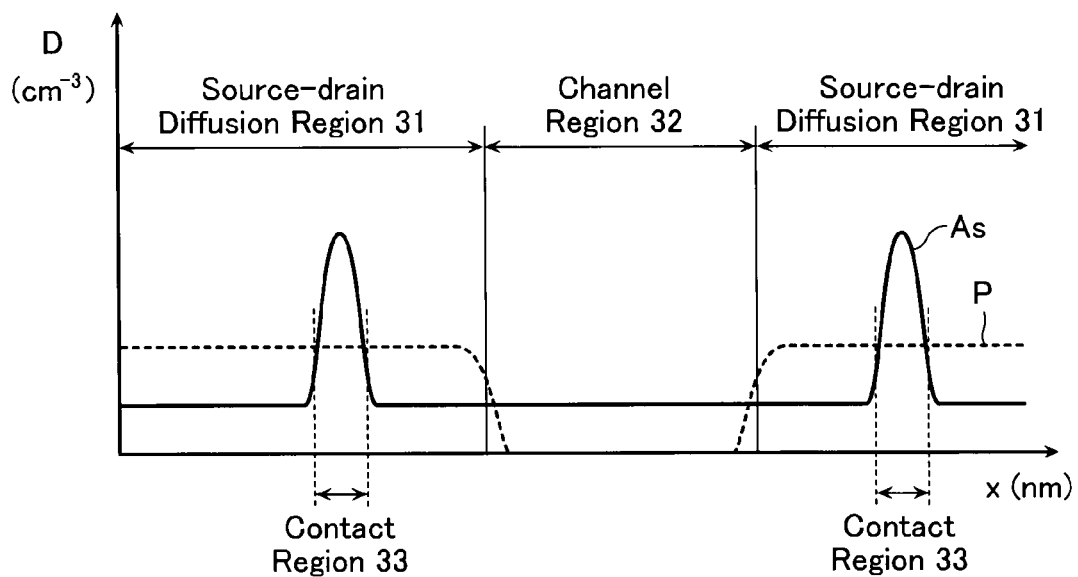
FIG. 15 shows the distributions of the concentration of phosphorus and the concentration of arsenic within the semiconductor substrate 1 of the transistor shown in FIGS. 10 and 11.

FIG. 15 shows the distributions of the concentration of phosphorus and the concentration of arsenic within the semiconductor substrate 1 in FIGS. 10 and 11.

Due to the fact that arsenic is used as the impurity ion implanted to channel region 22 and contact region 23, and phosphorus is used as the impurity ion implanted to the source-drain diffusion region 21, a difference can be seen in the impurity concentration within the respective source-drain diffusion regions 21. That is to say, as is clear from FIGS. 14 and 15, in the transistor shown in FIGS. 8 and 9, arsenic is not implanted to the source-drain diffusion region 21 except in the contact region 23 and the overlapping region 24. This differs from the transistor shown in FIGS. 10 and 11.

Figure 16:
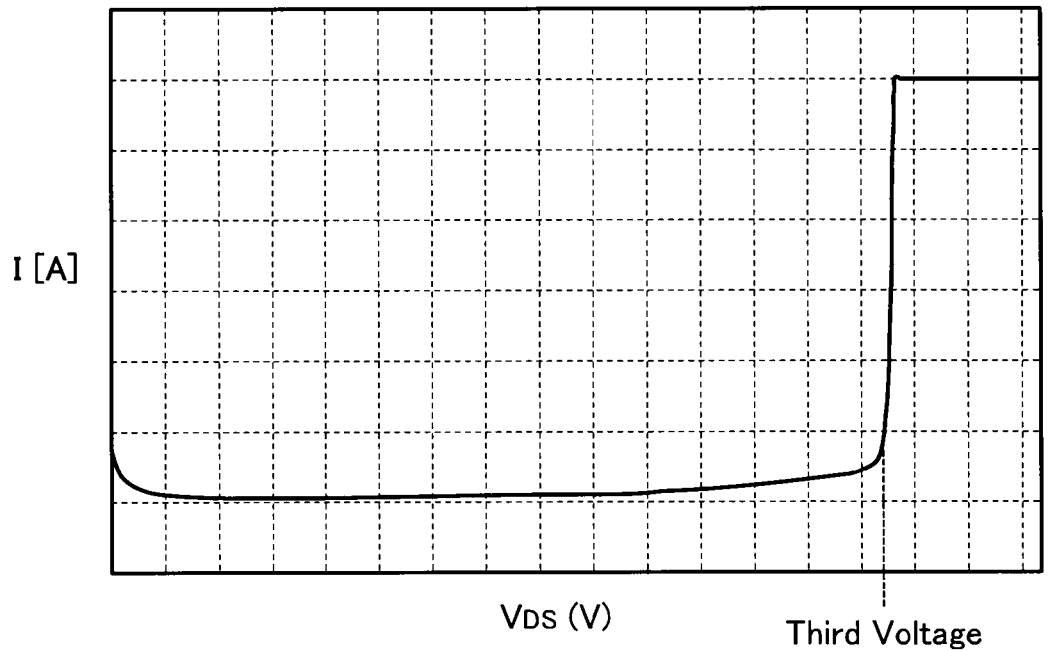
FIG. 16 is a graph showing characteristics of the transistor shown in FIG. 8.
Figure 17:
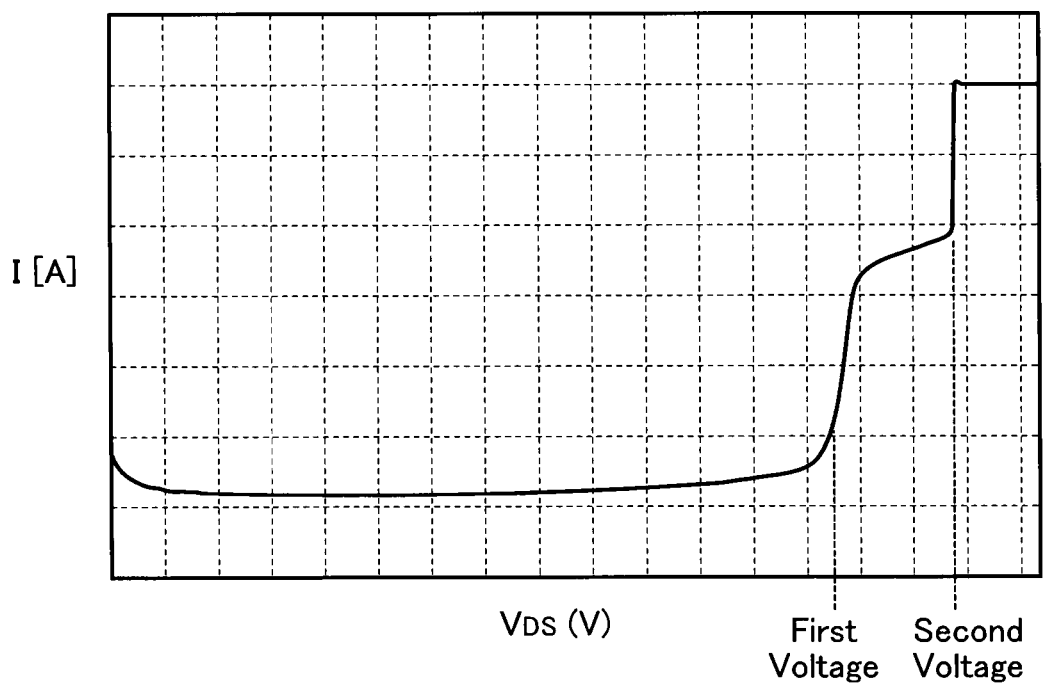
FIG. 17 is a graph showing characteristics of the transistor shown in FIG. 10.

Next, FIG. 16 shows the relationship between drain-source voltage $V_{DS}$ and drain current I of the transistor shown in FIGS. 8 and 9 (a first transistor). FIG. 17 shows the relationship between drain-source voltage $V_{DS}$ and drain current I of the transistor shown in FIGS. 10 and 11 (a second transistor). Note that the first transistor as a measured object in FIG. 16 is made equal to the second transistor as a measured object in FIG. 17 in element size. Also, the horizontal axes of FIGS. 16 and 17 are scaled in the same way.

As shown in FIG. 17, in the second transistor shown in FIGS. 10 and 11, when the voltage $V_{DS}$ exceeds a first voltage, the leak current becomes larger (soft breakdown), and when it finally exceeds the intrinsic breakdown voltage at a second voltage higher than the first voltage, the breakdown occurs. In contrast, as shown in FIG. 16, in the first transistor shown in FIGS. 8 and 9, the voltage $V_{DS}$ exceeds the intrinsic breakdown voltage at a third voltage, and then the breakdown occurs. Almost no increase in leak current (soft breakdown) can be found when the voltage $V_{DS}$ is below the third voltage. That is to say, the transistor shown in FIGS. 8 and 9 shows a superior soft breakdown voltage characteristic compared to the transistor shown in FIGS. 10 and 11. However, the third voltage is lower than the second voltage, and the intrinsic voltage by which the breakdown finally occurs is lower in the first transistor than the second transistor. Consequently, it is suitable or ideal to use the transistor shown in FIGS. 8 and 9 in elements where the intrinsic breakdown voltage may be low but a high soft breakdown voltage is needed. In this way, the soft breakdown voltage can be raised without enlarging the area of the transistor. In addition, as is clear from a comparison of FIGS. 16 and 17, the third voltage is larger than the first voltage. Note that although FIG. 16 illustrates a graph as if the drain current I hardly increases even if the voltage $V_{DS}$ becomes the third voltage or more, the fact is that the current flow is controlled to avoid the measuring device from being destroyed. This also applies to FIG. 17 when the voltage $V_{DS}$ becomes the second voltage or more.

On the other hand, in the case where the intrinsic breakdown voltage must be set high but the soft breakdown voltage may be low, a conventional transistor shown in FIGS. 10 and 11 can be used. In this way, the embodiment of the present invention makes it possible to achieve a required intrinsic breakdown voltage and soft breakdown voltage by appropriate use of the two types of transistors (the first and second transistors) without enlarging element area of transistors. Moreover, a first and second transistor with different breakdown voltage characteristics can be formed simultaneously on the semiconductor substrate simply by altering the channel region.

Figure 18:
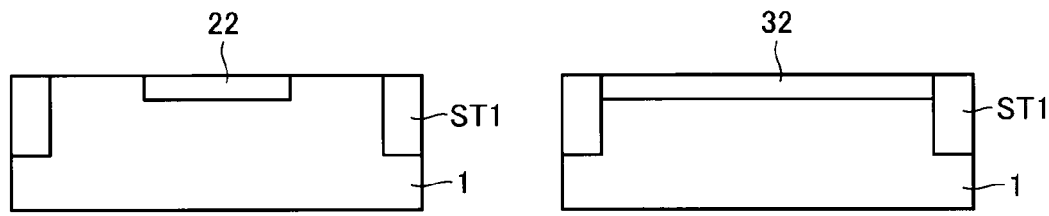
FIG. 18 is a process drawing explaining a method for making the semiconductor memory device in accordance with an embodiment of the present invention.
Figure 19:
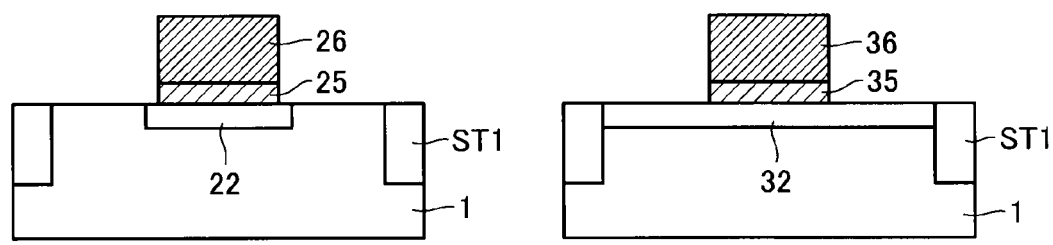
FIG. 19 is a process drawing explaining a method for making the semiconductor memory device in accordance with an embodiment of the present invention.
Figure 20:
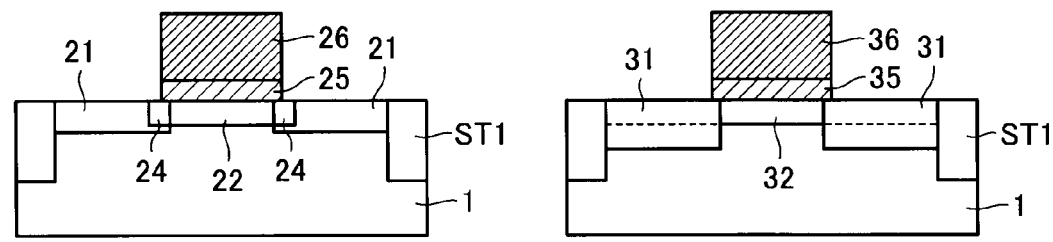
FIG. 20 is a process drawing explaining a method for making the semiconductor memory device in accordance with an embodiment of the present invention.

A method for making this transistor of a peripheral circuit in a non-volatile semiconductor memory device is explained referring to FIGS. 18-20. The left side of FIGS. 18-20 shows a step for making a D-type n-channel MOS transistor in accordance with an embodiment of the present invention shown in FIGS. 8 and 9, and the right side of FIGS. 18-20 shows a step for making a conventional D-type n-channel MOS transistor shown in FIGS. 10 and 11.

First, as shown in FIG. 18, after formation of element isolation insulating film ST1, channel implantation with, for example, arsenic (As) as impurity is performed to form the channel regions 22 and 32 on the semiconductor substrate 1.

The channel region 22 is formed only directly below and in the vicinity of the region where gate electrode 26 is later formed, by using a mask made of photoresist using photolithography technology, for example.

On the other hand, channel region 32 is formed in the entire region of the active area of the D-type n-channel MOS transistor.

Moreover, these channel regions 22 and 32 may be formed in the same step to decrease the number of manufacturing steps. As a result, the impurity concentrations in the channel regions 22 and 32 of the first transistor and the second transistor are almost equal.

Next, as shown in FIG. 19, the gate electrodes 26 and 36 are formed via gate insulating films 25 and 35.

Subsequently, as shown in FIG. 20, ion implantation of phosphorus (P) or the like as impurity is performed in a self-aligning manner with the gate electrodes 26 and 36 as masks, to form source-drain diffusion regions 21 and 31.

Note that the channel region 22 is formed only directly below and in the vicinity of gate electrode 26. Therefore the overlapping region 24 is formed directly below the edge of the gate electrode 26 where the channel region 22 and the source-drain diffusion region 21 overlap. The source-drain diffusion regions 21 and 31 may be formed in the same step, in order to decrease the number of manufacturing steps. As a result, the impurity concentrations in the source-drain diffusion regions 21 and 31 of the first transistor and the second transistor are almost equal.

Finally, the contact regions 23 and 33 are formed by additional ion implantation of arsenic (As) or the like to the source-drain diffusion regions 21 and 31, thereby completing the transistors shown in FIGS. 8 and 10.

Furthermore, simultaneous formation of channel regions 22 and 32, and source-drain diffusion regions 21 and 31 in the first and second transistors makes it possible to simultaneously form first and second transistors with different breakdown voltage characteristics on the semiconductor substrate, without increasing the number of steps.

Having described embodiments of the present invention, it should be noted that the present invention is not limited to the above-described embodiments, and that various alterations, additions or the like are possible without departing from the spirit of the invention. For example, in an above-described embodiment, all of the D-type n-channel transistors are formed to have a configuration shown in FIGS. 8 and 9, in which the channel region 21 is formed only directly below the gate electrode 26.

However, it is also possible that some of the D-type n-channel transistors may adopt a structure shown in FIGS. 8 and 9 and the other D-type n-channel transistors may adopt a structure shown in FIGS. 10 and 11, depending on the differences in threshold voltage and the like.

Figure 21:
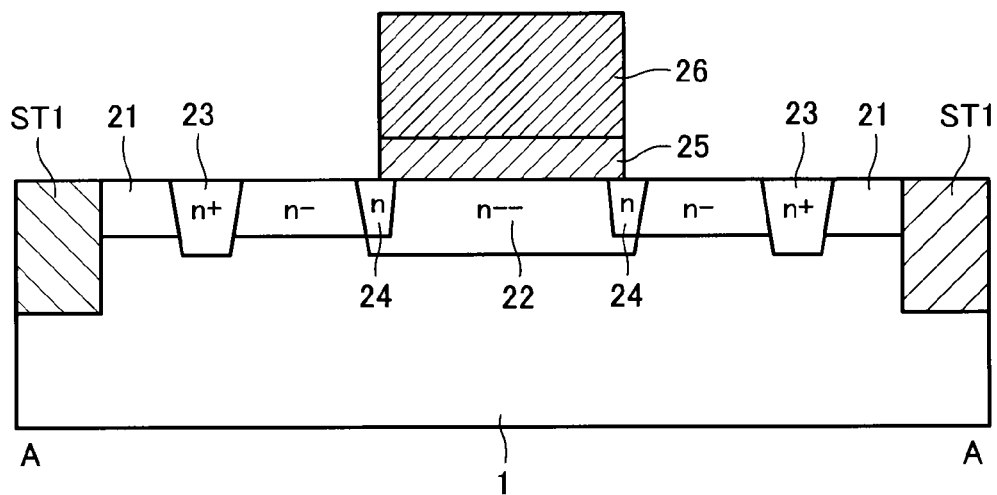
FIG. 21 is another example of a cross-sectional view showing the configuration of a D-type n-channel MOS transistor included in the semiconductor memory device in accordance with an embodiment of the present invention.

In addition, in FIG. 9, the junction depth of the channel region 22 is illustrated as being smaller than that of the source/drain diffusion region 21. But it is also possible, as shown in FIG. 21, that the junction depth of the channel region 22 is larger than that of the source/drain diffusion region 21.

Figure 22:
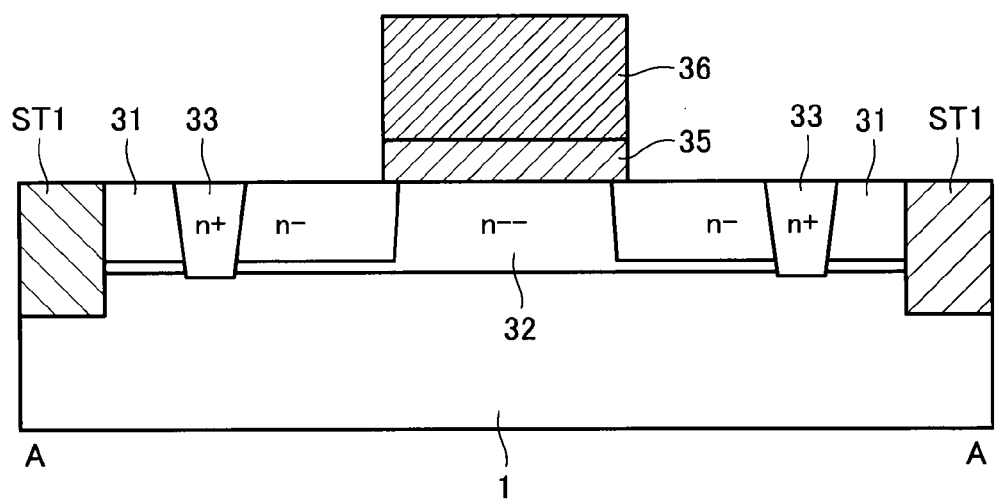
FIG. 22 is another example of a cross-sectional view showing the configuration of a conventional D-type n-channel MOS transistor.

Likewise, in FIG. 11, the junction depth of the channel region 32 is illustrated as being smaller than that of the source/drain diffusion region 31. But it is also possible, as shown in FIG. 22, that the junction depth of the channel region 32 is larger than that of the source/drain diffusion region 31.

What is claimed is:

1. A non-volatile semiconductor memory device, comprising:
   a memory cell array including memory cell transistors arranged therein, the memory cell transistors being provided with a charge accumulation layer formed on a semiconductor substrate via a gate insulating film; and a peripheral circuit configured to drive the memory cell transistors, the peripheral circuit including at least a first transistor, the first transistor further comprising:

a semiconductor layer of a second conductivity type;

a first gate electrode formed on a surface of the semiconductor layer via the gate insulating film;

a first channel region of a first conductivity type having a first impurity concentration and formed on a surface of the semiconductor layer directly below and in the vicinity of the first gate electrode, the first conductivity type being of the opposite conduction type to the second conductivity type;

first source-drain regions of the first conductivity type having a second impurity concentration which is greater than the first impurity concentration and formed on the surface of the semiconductor layer;

contact regions of the first conductivity type having a fourth impurity concentration which is greater than the second impurity concentration and formed on at least a portion of a surface of the first source-drain regions; and overlapping regions of the first conductivity type having a third impurity concentration which is greater than the second impurity concentration and formed on the surface of the semiconductor layer directly below and in the vicinity of the gate electrode where the channel region and the source-drain regions overlap, the contact regions each being formed in a position more distant from the first gate electrode than respective one of the overlapping regions, with the respective one of the first source-drain regions interposed therebetween.

2. The non-volatile semiconductor memory device according to claim 1, wherein an impurity implanted in the first channel region and an impurity implanted in the first source-drain regions are of different elements.

3. The non-volatile semiconductor memory device according to claim 2, wherein an impurity implanted in the first channel region is arsenic (As) and an impurity implanted in the first source-drain regions is phosphorus (P).

4. The non-volatile semiconductor memory device according to claim 1, wherein the peripheral circuit further comprises second transistors, the second transistors each comprising:

a gate electrode electrically connected to a drain of the first transistor; and a source electrically connected to plural gates of the memory cell transistors, wherein the first transistor is depletion-type (D-type).

5. The non-volatile semiconductor memory device according to claim 1, wherein the first source-drain regions are formed in a self-aligning manner with respect to the gate electrode.

6. The non-volatile semiconductor memory device according to claim 1, wherein the peripheral circuit further comprises a second transistor in addition to the first transistor, the second transistor comprising:

a second gate electrode formed on the surface of the semiconductor layer via the gate insulating film;

a second channel region of the first conductivity type having a fifth impurity concentration and formed on a surface of the semiconductor layer including directly below the second gate electrode; and second source-drain regions of the first conductivity type having a sixth impurity concentration greater than the fifth impurity concentration.

7. The non-volatile semiconductor memory device according to claim 6, wherein an impurity implanted in the first channel region and the second channel region, and an impurity implanted in the first source-drain regions and the second source-drain regions are of different elements.

8. The non-volatile semiconductor memory device according to claim 6, wherein the first impurity concentration and the fifth impurity concentration are the same, and the third impurity concentration and the sixth impurity concentration are the same.

9. A depletion-type MOS transistor, comprising:

a semiconductor layer of a second conductivity type;

a gate electrode formed on a surface of the semiconductor layer via a gate insulating film;

a channel region of a first conductivity type having a first impurity concentration and formed on a surface of the semiconductor layer directly below and in the vicinity of the gate electrode, the first conductivity type being of the opposite conduction type to the second conductivity type;

source-drain regions of the first conductivity type having a second impurity concentration which is greater than the first impurity concentration and formed on the surface of the semiconductor layer;

contact regions of the first conductivity type having a fourth impurity concentration which is greater than the second impurity concentration and formed on at least a portion of a surface of the source-drain regions; and overlapping regions of the first conductivity type having a third impurity concentration which is greater than the second impurity concentration and formed on the surface of the semiconductor layer directly below and in the vicinity of the gate electrode where the channel region and the source-drain region overlap, the contact regions each being formed in a position more distant from the first gate electrode than respective one of the overlapping regions, with the respective one of the source-drain regions interposed therebetween.

10. The depletion-type MOS transistor according to claim 9, wherein an impurity implanted in the channel region and an impurity implanted in the source-drain regions are of different elements.

11. The depletion-type MOS transistor according to claim 10, wherein an impurity implanted in the channel region is arsenic (As) and an impurity implanted in the source-drain regions is phosphorus (P).

12. The depletion-type MOS transistor according to claim 9, wherein the source-drain regions are formed in a self-aligning manner with respect to the gate electrode.

13. The non-volatile semiconductor memory device according to claim 9, wherein the overlapping regions each protrudes past edges of the gate electrode by 10 nm-1 um in a direction parallel to a substrate.

14. The non-volatile semiconductor memory device according to claim 6, wherein the peripheral circuit further comprises third transistors, the third transistors each comprising:

a gate electrode electrically connected to a drain of the first transistor; and a source electrically connected to plural gates of the memory cell transistors.

15. The non-volatile semiconductor memory device according to claim 1, wherein the overlapping regions each protrudes past edges of the gate electrode by 10 nm-1 um in a direction parallel to a substrate.

* * * * *